United States Patent
Park

(10) Patent No.: US 7,961,492 B2
(45) Date of Patent: Jun. 14, 2011

(54) CHARGE STORAGE CIRCUIT, VOLTAGE STABILIZER CIRCUIT, METHOD FOR STORING CHARGE USING THE SAME

(75) Inventor: Byoung-Kwon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 198 days.

(21) Appl. No.: 12/326,144

(22) Filed: Dec. 2, 2008

(65) Prior Publication Data

US 2010/0054023 A1   Mar. 4, 2010

(30) Foreign Application Priority Data

Aug. 29, 2008 (KR) .................. 10-2008-0085379

(51) Int. Cl.
*G11C 11/22* (2006.01)
(52) U.S. Cl. ........................................ 365/145; 365/149
(58) Field of Classification Search .................. 365/145, 365/149
See application file for complete search history.

(56) References Cited

U.S. PATENT DOCUMENTS 6,172,897 B1 * 1/2001 Shuto ........................... 365/145

FOREIGN PATENT DOCUMENTS

| KR | 1020060083568 A | 7/2006 |
| KR | 1020070042249 A | 4/2007 |

OTHER PUBLICATIONS

Notice of Allowance issued from Korean Intellectual Property Office on Oct. 28, 2009.

* cited by examiner

*Primary Examiner* — Huan Hoang
*Assistant Examiner* — Jason Lappas
(74) *Attorney, Agent, or Firm* — IP & T Group LLP

(57) ABSTRACT

A charge storage circuit includes a plurality of word lines, a plurality of bit lines, and a plurality of memory cells connected to a corresponding word line among the word lines and connected to a corresponding bit line among the bit lines. Each of the memory cells includes a transistor turned on in response to a predetermined voltage of the corresponding word line and connected to the corresponding bit line, and a capacitor having one end connected to the transistor and the other end connected to the corresponding word line.

13 Claims, 4 Drawing Sheets

# CHARGE STORAGE CIRCUIT, VOLTAGE STABILIZER CIRCUIT, METHOD FOR STORING CHARGE USING THE SAME

CROSS-REFERENCE TO RELATED APPLICATION

The present invention claims priority of Korean patent application number 10-2008-0085379, filed on Aug. 29, 2008, which is incorporated by reference in its entirety.

BACKGROUND OF THE INVENTION

The present invention relates to a charge storage circuit, a voltage stabilizer circuit using the same, and a method for storing charge, and more particularly, to a charge storage circuit using a memory cell of a dynamic semiconductor memory device, a voltage stabilizer circuit using the same, and a method for storing charge.

A supply voltage is a voltage applied to a semiconductor device. A reservoir capacitor is used to prevent the supply voltage from changing by external noise, and a storage capacitor is a capacitor that stabilizes the supply voltage of the semiconductor device by storing charge corresponding to the supply voltage in order to stably apply power to an internal circuit of the semiconductor device. The reservoir capacitor is generally disposed at a peripheral area generally except a memory cell area. In general, the reservoir capacitor is embodied using a MOS capacitor that uses a capacitance of a gate oxide layer of a MOS transistor.

FIG. 1 is a diagram illustrating a MOS capacitor 101 used as a reservoir capacitor according to the related art.

Referring to FIG. 1, the MOS capacitor 101 is embodied using an MOS transistor having a gate for receiving a supply voltage VDD and a source and a drain connected to each other and receiving a ground voltage VSS. An oxide layer of the gate functions as dielectric among the gate, drain, and source and stores charge corresponding to the supply voltage VDD. The MOS capacitor 101 may be realized using a PMOS transistor. In this case, a gate receives a ground voltage VSS and a drain receives a supply voltage VDD.

FIGS. 2A and 2B are diagrams illustrating layouts of a reservoir capacitor with other circuit blocks for describing relations between layout and integration of a semiconductor device. FIG. 2B shows a semiconductor device more highly integrated than that shown in FIG. 2A.

In FIG. 2A, for example, the reservoir capacitor block 203 may have a size of 100 um×100 um (length×width), and the reservoir capacitor block 203 is disposed in an empty space between peripheral circuit blocks 201 and 205. The reservoir capacitor block 203 stabilizes a supply voltage VDD applied to the peripheral circuit blocks 201 and 205. The reservoir capacitor block 203 includes a plurality of reservoir capacitors for minimizing the variation of the supply voltage VDD.

Since the semiconductor device has been densely integrated and reduced in size, the circuit blocks 207 and 211 and a reservoir capacitor block 209 are also reduced in size as shown in FIG. 2B compared to those in FIG. 2A. In FIG. 2B, for example, a reservoir capacitor block 209 has a size of 60 um×60 um (length×width) and includes the smaller number of reservoir capacitors than the reservoir capacitor block 203 of FIG. 2A.

Therefore, the function of the reservoir capacitor block may be deteriorated and the circuit blocks may generate errors due to the variation of the supply voltage as the semiconductor device is reduced in size. If the reservoir capacitors block increases in size for stabilizing a supply voltage, a semiconductor device also increases in size, and Net Die, which is the number of chips per a wafer, is reduced.

SUMMARY OF THE INVENTION

Embodiments of the present invention are directed to providing a charge storage circuit for reducing a layout area and using a typical manufacturing process, a power stabilizing circuit using the same, and a method for storing charge.

In accordance with an aspect of the present invention, there is provided a charge storage circuit including a plurality of word lines, a plurality of bit lines, and a plurality of memory cells, each of the memory cells including a transistor connected at a first terminal to a bit line among the plurality of bit lines and connected at a second terminal to a word line among the plurality of word lines, and a capacitor connected at one end to a third terminal of the transistor and connected at the other end to the word line, wherein each of the memory cells is connected to a corresponding word line among the plurality of word lines and a corresponding bit line among the plurality of bit lines, and is turned on in response to a predetermined voltage on the corresponding word line.

In accordance with another aspect of the present invention, there is provided a power stabilizer circuit including: a plurality of word lines, each providing a first voltage; a plurality of bit lines, each providing a second voltage that is lower than the first voltage; and a plurality of memory cells, each of the memory cells comprising transistor and a capacitor, connected to a corresponding word line among the plurality of word lines, and connected to a corresponding bit line among the plurality of bit lines, wherein an electric potential difference between both ends of the capacitor is equal to the difference between the first voltage and the second voltage.

In accordance with still another aspect of the present invention, there is provided a method for storing charge including: applying a first voltage to a plurality of word lines each connected to the gate of one of a plurality of cell transistors; applying a second voltage lower than the first voltage to a plurality of bit lines, each of the bit lines connected to a first terminal of one of the plurality of cell transistors; and applying the first voltage to a plurality of cell capacitors each having one end connected to a second terminal of one of the cell transistors.

DESCRIPTION OF SPECIFIC EMBODIMENTS

Other objects and advantages of the present invention can be understood by the following description, and become apparent with reference to the embodiments of the present invention.

Figure 3:
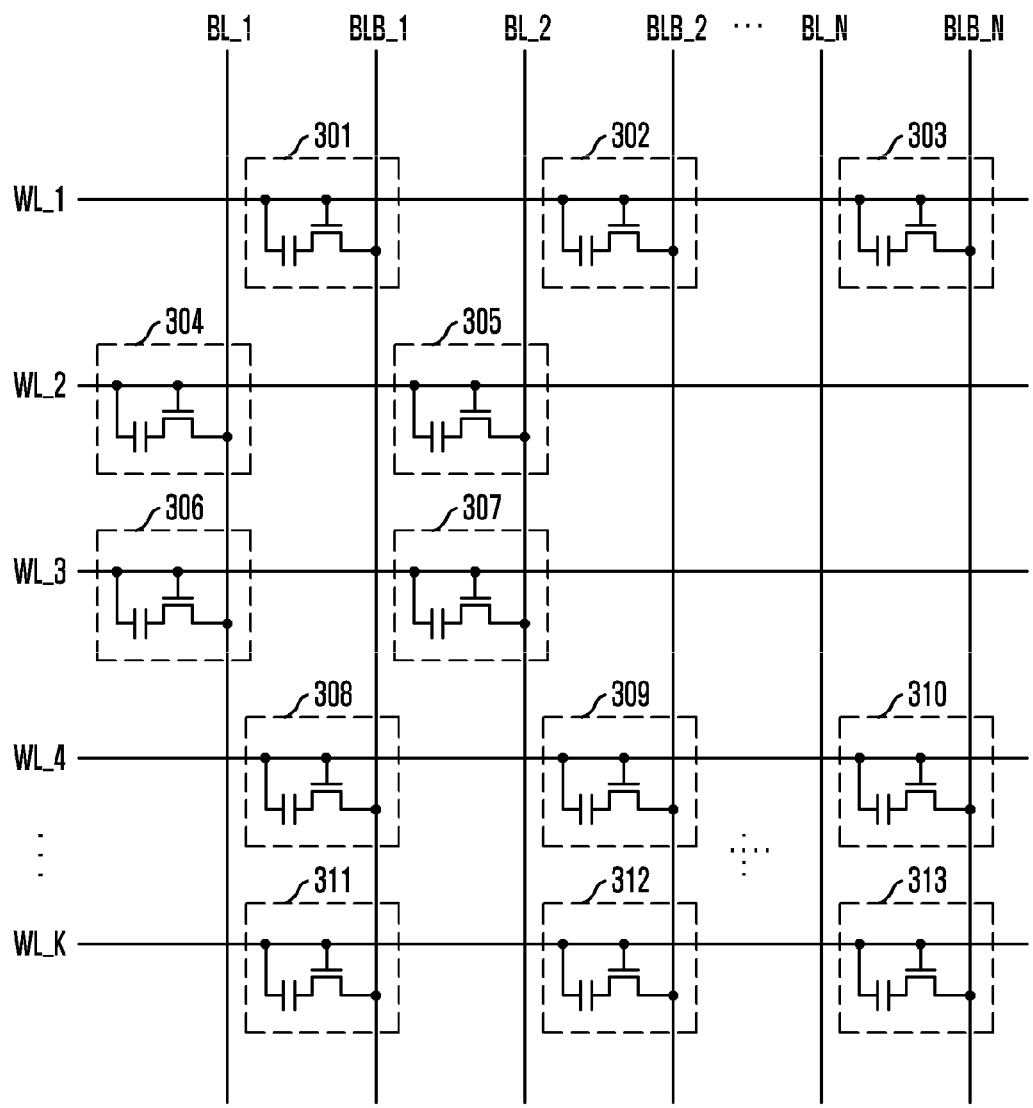
FIG. 3 is a diagram illustrating a charge storage circuit in accordance with an embodiment of the present invention.

FIG. 3 is a block diagram illustrating a charge storage circuit in accordance with an embodiment of the present invention.

As shown in FIG. 3, the charge storage circuit according to the present embodiment includes a plurality of word lines WL_1 to WL_K, a plurality of bit lines BL_1 to BL_N, BLB_1 to BLB_N, and a plurality of memory cells 301 to 313.

Figure 5:
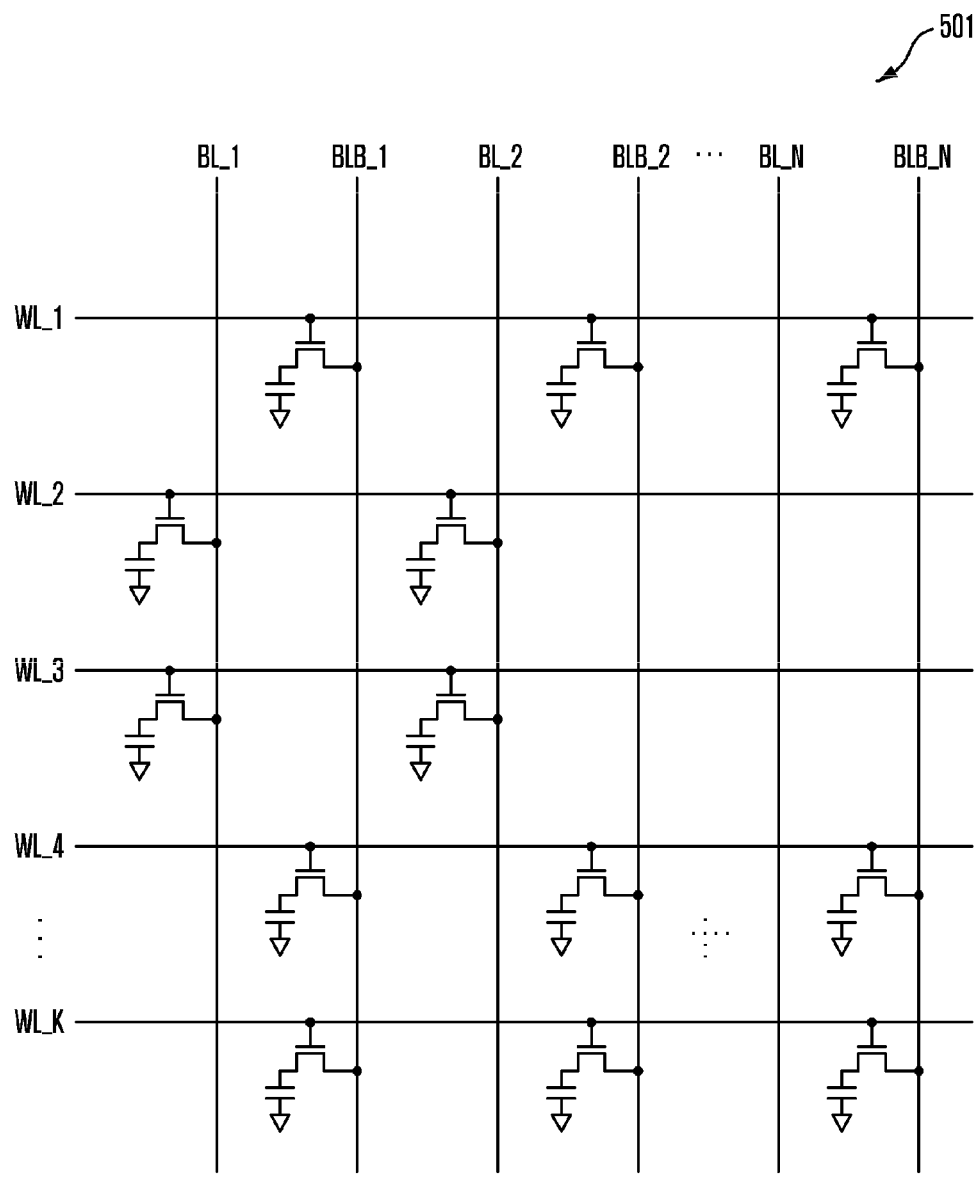
FIG. 5 is a diagram illustrating a cell array of a dynamic semiconductor memory device.

The charge storage circuit according to the present embodiment stores charge using a cell array 501 of a typical dynamic semiconductor memory device such as a dynamic random access memory (DRAM) shown in FIG. 5. The cell array 501 of FIG. 5 includes a plurality of word lines WL_1 to WL_K, a plurality of bit lines BL_1 to BL_N and BLB_1 to BLB_N, a plurality of memory cells. The cell array 501 is a part of the dynamic semiconductor memory device, which stores data. The cell array 501 occupies a large area of the dynamic semiconductor memory device. Also, the cell array 501 is formed in matrix. That is, the word lines WL_1 to WL_K, the bit lines BL_1 to BL_N and BLB_1 to BLB_N, and memory cells are regularly arranged. Therefore, the arrangement of the word lines WL_1 to WL_K, the bit lines BL_1 to BL_N and BLB_1 to BLB_N, and the memory cells is optimized to reduce an area occupied by the cell array 501 in the dynamic semiconductor device. Also, the word lines WL_1 to WL_K, the bit lines BL_1 to BL_N and BLB_1 to BLB_N, and the memory cells are arranged to store maximum data in a unit area. The charge storage circuit according to the present embodiment can store great charge in a small area by storing charge using such a cell array 501 of the dynamic semiconductor memory device.

Since it is possible to use a typical process for manufacturing a cell array in order to apply the charge storage circuit according to the present embodiment to a semiconductor device as it is, the charge storage circuit according to the present embodiment can be embodied without additional manufacturing processes.

Referring to FIG. 3 again, connection of transistors and capacitors forming memory cells 301 to 313 is different from that in the memory cell of FIG. 5 because the memory cells 301 to 313 according to the present embodiment store charge although the memory cells of FIG. 5 stores data.

Each of the memory cells 301 to 313 includes a transistor turned on in response to a predetermined voltage of each of the word lines WL_1 to WL_K and a capacitor having one end connected to the transistor and the other end connected to the word lines WL_1 to WL_K. The transistor operates as an MOS transistor because a channel is formed between a drain and a source if the transistor is turned on by a predetermined voltage of the word lines WL_1 to WL_K. Therefore, the memory cells 301 to 313 can store charge by the capacitor and the transistor that operates as an MOS transistor.

The capacitance of each of the memory cells 301 to 313 is equivalent to the sum of capacitance of the capacitor and the transistor operating as the MOS capacitor because the capacitor is connected to the transistor operating as the MOS capacitor in parallel. Since the memory cells 301 to 313 connected to each of the word lines WL_1 to WL_K and the bit lines BL_1 to BL_N and BLB_1 to BLB_N are connected in parallel, capacitance of the charge storage circuit according to the present embodiment is equivalent to the sum of capacitance of all memory cells 301 to 313 if all of the word lines WL_1 to WL_K are connected in parallel and all of the bit lines BL_1 to BL_N and BLB_1 to BLB_N are connected in parallel.

For example, the charge storage circuit according to the present embodiment can operate as a resistor-capacitor (RC) circuit if one end of each word line is connected to a resistor which is connected to a ground voltage because all of the word lines WL_1 to WL_K are connected in parallel and if all of the bit lines BL_1 to BL_N and BLB_1 to BLB_N are connected to a ground voltage because the bit lines are connected in parallel.

Figure 1:
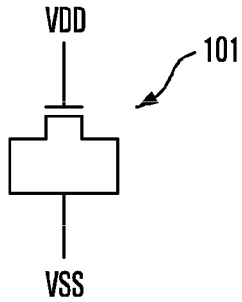
FIG. 1 is a diagram illustrating a MOS capacitor 101 used as a reservoir capacitor according to the related art.
Figure 2A:
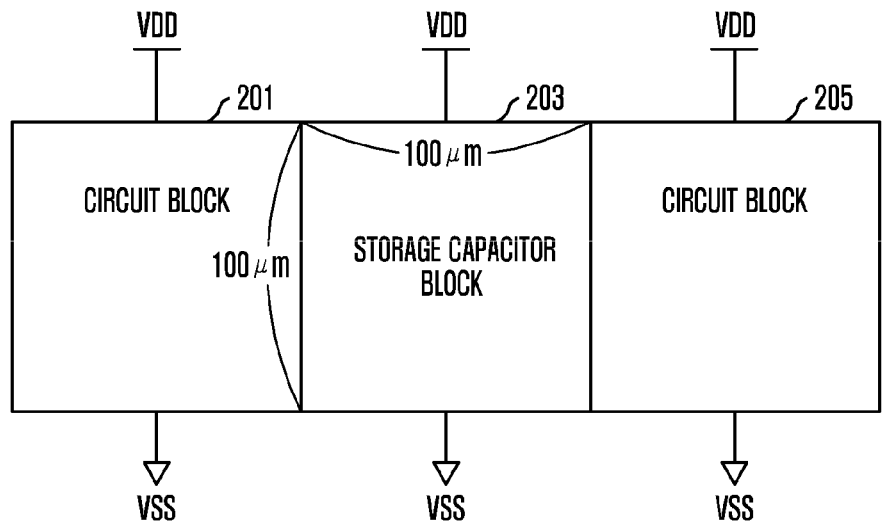
FIGS. 2A and 2B are layouts of a reservoir capacitor with circuit blocks for describing relations between layout and integration of a semiconductor device.
Figure 2B:
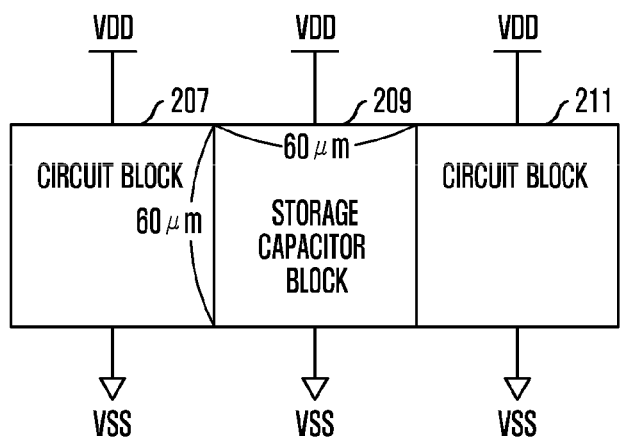

Unlike the MOS capacitor shown in FIG. 1, the transistors of the memory cells 301 to 313 according to the present embodiment operate as an MOS capacitor only if the transistors are turned on in response to a predetermined voltage of the word lines WL_1 to WL_K. Therefore, it is preferable that a threshold voltage of the transistor is lower than a predetermined voltage of the word lines WL_1 to WL_K. When the charge storage circuit according to the present embodiment is used in a predetermined circuit, it is preferable that the word lines WL_1 to WL_K connected in parallel are connected to a node having a relatively high voltage and that the bit lines BL_1 to BL_N and BLB_1 to BLB_N connected in parallel are connected to a node having a relatively low voltage.

Although the cell array formed in a folded bit line structure is shown in FIG. 3, it is obvious to those skilled in the art that the charge storage circuit according to the present invention can be realized using a cell array having an open bit line structure.

Figure 4:
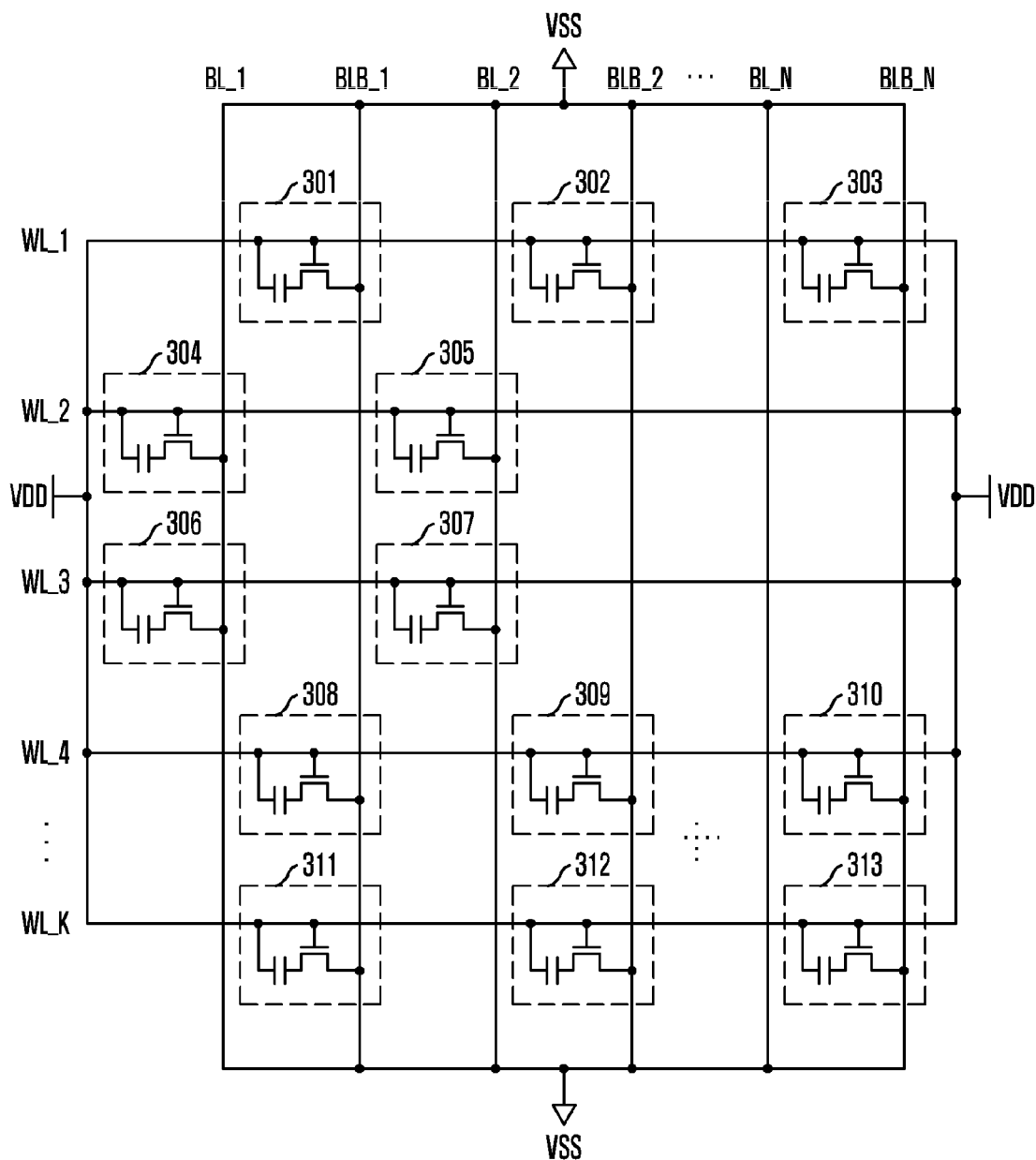
FIG. 4 is a diagram illustrating a charge storage circuit that operates as a power stabilizer circuit, that is, a storage capacitor in accordance with an embodiment of the present invention.

FIG. 4 is a diagram illustrating a power stabilizer circuit using a charge storage circuit according to an embodiment of the present invention. The power stabilizer circuit has features similar to those of the reservoir capacitor.

The word lines WL_1 to WL_K are connected to a supply voltage VDD, and the bit lines BL_1 to BL_N and BLB_1 to BLB_N are connected to the ground voltage VSS. Since a channel is formed between a source and a drain of a transistor when the transistors of the memory cells 301 to 313 are turned on, electric potential difference between both ends of a capacitor of the memory cells 301 to 313 is equivalent to difference between a supply voltage VDD and a ground voltage VSS. The power stabilizer circuit according to the present embodiment stores charge in the memory cells 301 to 313 by the supply voltage VDD. Therefore, the power stabilizer circuit according to the present embodiment sustains the electric potential difference between the supply voltage VDD and the ground voltage VSS although the supply voltage VDD degreases by external noise, thereby preventing a circuit using the supply voltage VDD from error caused by the variation of the supply voltage VDD.

The power stabilizer circuit according to the present embodiment uses the cell array 501 of the dynamic semiconductor memory device as described above unlike a reservoir capacitor according to the related art. Therefore, a layout area is reduced. Also, the power stabilizer circuit according to the present embodiment can be realized without additional manufacturing processes because a typical cell array manufacturing process can be used as it is for applying the power stabilizer circuit according to the present embodiment to the semiconductor memory device.

Meanwhile, the word lines WL_1 to WL_K and the bit lines BL_1 to BL_N and BLB_1 to BLB_N can be connected to a supply voltage used by a predetermined circuit beside the supply voltage VDD and the ground voltage VSS. In this case, the power stabilizer circuit according to the present embodiment can prevent the predetermined circuit from error. For example, the power stabilizer circuit according to the present embodiment is connected to supply voltage VPERI used in peripheral circuits of a semiconductor memory device and a driver for driving word lines of the semiconductor memory device, thereby enabling the peripheral circuits and the driver to stably operate.

Hereinbefore, the present invention was described in a view of apparatus. However, operation of each constituent element in the charge storage circuit according to the present embodiment can be effectively understood in a view of process. Therefore, the operation of each constituent element of in the charge storage circuit according to the present embodiment can be described as each step of a charge storage method according to an embodiment of the present invention. Hereinafter, the charge storage method according to an embodiment of the present invention will be described with reference to FIGS. 3 to 5.

The charge storage method according to the present embodiment includes applying a first voltage to a plurality of word liens connected to gates of a plurality of cell transistors, applying a second voltage lower than the first voltage to a plurality of bit lines connected to one ends of a plurality of cell transistors, and applying the first voltage to the other ends of cell capacitors connected to the other ends of the cell transistors.

The cell transistor and the cell capacitor are a transistor and a capacitor in a memory cell of a dynamic semiconductor memory device. It is preferable that one end of the cell transistor is a drain region, and the other end of the cell transistor is a source region. It is preferable that the first voltage is higher than the second voltage. It is also preferable that the first voltage is higher than a threshold voltage of the cell transistor. The first voltage may be the supply voltage VDD and the second voltage may be the ground voltage VSS.

Since the charge storage method according to the present embodiment can store charge using a memory cell of a dynamic semiconductor memory device, it is possible to reduce a layout area. Also, the charge can be stored without major process modification because the charge can be stored adding the applying the first voltage to the other end of the cell capacitor based on a typical cell array manufacturing process.

Embodiments of the present invention relate to a charge storage circuit, a power stabilizer circuit using the same and a charge storage method. The charge storage circuit, the power stabilizer circuit, and the charge storage method can store charge and stabilize power using a cell array of a dynamic semiconductor memory device. Therefore, a layout area can be reduced, and a cell array manufacturing process can be used.

While the present invention has been described with respect to the specific embodiments, it will be apparent to those skilled in the art that various changes and modifications may be made without departing from the spirit and scope of the invention as defined in the following claims.

What is claimed is:

1. A charge storage circuit comprising:
a plurality of word lines commonly connected to a first voltage terminal;
a plurality of bit lines commonly connected to a second voltage terminal; and
a plurality of memory cells, wherein each of the memory cells includes a transistor provided with first, second and third terminals and a capacitor, the transistor is connected at the first terminal to a corresponding bit line among the plurality of bit lines and connected at the second terminal to a corresponding word line among the plurality of word lines, and the capacitor is connected at a first end thereof to the third terminal and connected at a second end thereof to the corresponding word line,
wherein the plurality of memory cells are configured to be turned on as a unit in response to a first voltage applied to the first voltage terminal.

2. The charge storage circuit of claim 1, wherein the overall capacitance formed between the first voltage terminal and the second voltage terminal by the plurality of memory cells is equal to the sum of individual capacitances of the memory cells.

3. The charge storage circuit of claim 1, wherein a threshold voltage of the transistor is lower than the first voltage.

4. A power stabilizer circuit comprising:
a plurality of word lines, wherein the plurality of word lines are commonly connected to a first voltage terminal and the first voltage terminal is arranged to receive a first voltage;
a plurality of bit lines, wherein the plurality of bit lines are commonly connected to a second voltage terminal and the second voltage terminal is arranged to receive a second voltage lower than the first voltage; and
a plurality of memory cells, wherein each of the memory cells comprises a transistor and a capacitor that are connected between a corresponding word line among the plurality of word lines and a corresponding bit line among the plurality of bit lines,
wherein, for each of the plurality of memory cells, an electric potential difference between first and second ends of the capacitor is equal to a difference between the first voltage and the second voltage.

5. The power stabilizer circuit of claim 4, wherein the transistors of the memory cells are configured to be turned on as a unit in response to the first voltage applied to the first voltage terminal.

6. The power stabilizer circuit of claim 4, wherein one end of the capacitor is connected to the transistor and the other end of the capacitor is connected to the second voltage.

7. The power stabilizer circuit of claim 4, wherein the transistor is configured to sustains a turn-on state in response to the second voltage.

8. The power stabilizer circuit of claim 4, wherein the overall capacitance formed between the first voltage terminal and the second voltage terminal by the plurality of memory cells is equal to the sum of individual capacitances of the memory cells.

9. A method for storing charge, comprising:
applying, through a first voltage terminal, a first voltage to a gate of the cell transistor of each pair of cell transistor and cell capacitor pairs and to an end of the cell capacitor of the cell transistor and capacitor pair, wherein the cell capacitor has another end coupled to the cell transistor, the first voltage terminal is commonly coupled to a plurality of word lines, and the word lines are each coupled to a corresponding one of the cell transistors; and
applying a second voltage lower than the first voltage to a first terminal of each cell transistor of the cell transistor and cell capacitor pairs through a second voltage terminal, wherein the second voltage terminal is commonly coupled to a plurality of bit lines and the bit lines are each connected to a corresponding cell transistor of the cell transistor and cell capacitor pairs.

10. The method of claim 9, wherein the first terminal is a drain region and the second terminal is a source region.

11. The method of claim 9, wherein the first voltage is a supply voltage and the second voltage is a ground voltage.

12. The method of claim 9, wherein the overall capacitance formed between the first voltage terminal and the second voltage terminal by the cell transistor and cell capacitor pairs is equal to the sum of individual capacitances of each pair of the cell transistor and cell capacitor pairs.

13. The method of claim 9, wherein the cell transistors of the cell transistor and cell capacitor pairs are configured to be turned on as a unit in response to the first voltage applied to the first voltage terminal.

* * * * *